United States Patent [19]

Broom et al.

[11] Patent Number: 5,171,717
[45] Date of Patent: Dec. 15, 1992

[54] METHOD FOR BATCH CLEAVING SEMICONDUCTOR WAFERS AND COATING CLEAVED FACETS

[75] Inventors: Ronald F. Broom; Marcel Gasser; Christoph S. Harder, all of Zurich; Ernst E. Latta, Adliswil; Albertus Oosenbrug, Langnau; Heinz Richard, Kilchberg; Peter Vettiger, Langnau, all of Switzerland

[73] Assignee: International Business Machines Corporation, Armonk, N.Y.

[21] Appl. No.: 647,861

[22] Filed: Jan. 30, 1991

[30] Foreign Application Priority Data

May 25, 1990 [EP] European Pat. Off. ........ 90.810383.1

[51] Int. Cl.$^5$ .................. H01L 21/302; H01L 21/304
[52] U.S. Cl. .................................... 437/226; 437/227; 437/129
[58] Field of Search .............................. 437/227, 226; 148/DIG. 28; 204/225–298; 225/2; 118/915, 919

[56] References Cited

U.S. PATENT DOCUMENTS

| | | | |
|---|---|---|---|
| 2,180,837 | 11/1939 | Rudolph | 164/84.5 |
| 3,743,148 | 7/1973 | Carlson | 225/2 |
| 4,195,758 | 4/1980 | Morgan | 225/98 |
| 4,656,638 | 4/1987 | Tihanyi et al. | 372/49 |
| 4,904,610 | 2/1990 | Shyr | 437/211 |
| 4,951,601 | 8/1990 | Maydan et al. | 118/719 |
| 4,995,539 | 2/1991 | Richard | 225/2 |
| 5,000,817 | 3/1991 | Aine | 156/633 |

FOREIGN PATENT DOCUMENTS

| | | | |
|---|---|---|---|
| 1427717 | 12/1968 | Fed. Rep. of Germany . | |
| 2115306 | 10/1972 | Fed. Rep. of Germany . | |
| 0158497 | 12/1981 | Japan | 437/227 |
| 0079645 | 5/1982 | Japan | 437/226 |
| 0276232 | 12/1982 | Japan | 437/227 |
| 0276230 | 12/1986 | Japan | 437/227 |
| 0238641 | 10/1987 | Japan | 437/227 |

Primary Examiner—Olik Chaudhuri
Assistant Examiner—Loc Q. Trinh
Attorney, Agent, or Firm—Donald M. Boles; H. Daniel Schnurmann

[57] ABSTRACT

A method for cleaving semiconductor wafers, or segments thereof, which comprises placing the wafer, provided with scribe lines defining the planes where cleaving is to take place, inbetween a pair of flexible transport bands and guiding it around a curved, large radius surface thereby applying a bending moment. With a moment of sufficient magnitude, individual bars are broken off the wafer as this is advanced, the bars having front-and rear-end facets. On cleaving, each bar, while still pressed against the curved surface, is automatically separated whereby mutual damage of the facets of neighboring bars is prevented. For further handling, e.g. for the transport of the bars to an evaporation station for passivation layer deposition, provisions are made to keep the bars separated. Cleaving and the subsequent passivation coating can be carried out in-situ in a vacuum system to prevent facet contamination prior to applying the passivation.

12 Claims, 3 Drawing Sheets

METHOD FOR BATCH CLEAVING SEMICONDUCTOR WAFERS AND COATING CLEAVED FACETS

FIELD OF THE INVENTION

The present invention relates to a method and apparatus for cleaving semiconductor wafers or segments therof and for coating cleaved facets.

BACKGROUND OF THE INVENTION

Semiconductor laser diodes have found applications in a wide variety of information handling systems, because of their compact size and because their technology is compatible with that of the associated circuitry and electro-optical elements. They are presently used in areas such as data communication, optical storage and optical beam printing. Currently, most lasers consist of III/V compounds. Depending on the required laser beam wavelength, AlGaAs and InP system devices have found extensive usage.

Presently, the most commonly used laser structures are those where the mirrors terminating the laser cavity are obtained by cleaving. Normally, a wafer carrying a large number of epitaxially grown laser structures is cleaved into laser bars, the cleaved facets at both sides thereof determining the length of the cavity of the devices on the bar.

The cleaving process is normally started by diamond scratching or scribing the wafer surface to determine the crystallographic planes where cleaving is to take place. The scratch serves as a microcrack from whereby applying a bending moment, a controlled fracture completes the cleaving process. The required torque or shearing force is provided by wedges, "knives" or other small-radius tools.

Numerous processes and devices for laser cleaving have been suggested and pursued in the past. Some of these approaches are described in the following references:

German patent application 1,427,772 describes a process for breaking a scribed semiconductor wafer into individual bars. The wafer, held between foils, is placed on a soft-surface support. Cleaving is achieved by a hard, small-radius roller pressed against and moved across the wafer to provide the required torque.

U.S. Pat. No. 3,396,452 briefly described in the introduction and referenced in FIG. 3, is a conventional cleaving tool. It comprises a convex base member with a curvature compatible with the dimensions of the bars into which the wafer sandwiched between foils is to be broken. A non-uniform bending moment is applied by a complementary concave member pressed against the wafer which rests on the convex surface. The invention disclosed in the U.S. Patent relates to a method and apparatus where a scribed semiconductor wafer is advanced and subjected to pressure between a pair of opposing small-radius rollers of different resiliencies. The softer resiliency roller, being contiguous with the scribed wafer face, causes the wafer to break at the scribe lines.

"Process for Batch Cleaving GaAs and Similar Materials", published in the IBM Technical Disclosure Bulletin, Vol. 23, No. 10, March 1981, pp 4749–4750, provides a summary of the main requirements for controlled, non-damaging cleaving processes. It does not refer to any specific details of the process or the apparatus used.

European Patent Application 88.810 694.5, filed on Oct. 10, 1988, describes a method and apparatus for cleaving a semiconductor wafer. The wafer is sandwiched between two elastic foils: a soft lower foil with an adhesive surface to which the wafer "sticks", and a stronger upper foil. The foils are then fixed and stretched. The wafer, however, prevents the stretching, at least within the section of the lower foil to which it adheres. By passing a small-radius roller under the foils, the wafer is lifted and cleaved. The bars thus obtained still adhere to the now completely stretched lower foil, separated from each other by a distance that is sufficient to avoid damage from neighbouring cleaved mirror surfaces.

The methods and apparatus described in the above references do not meet the requirements of a high-quality batch cleave process which include:
gentle, stress-free fracturing along the desired crystallographic plane,
avoidance of damage to device structures due to external forces applied thereto during cleaving,
minimum handling of both the wafer and the resulting bars,
separation of the bars upon cleaving to prevent mechanical damage of neighbouring facets,
obtaining uncontaminated facets followed by immediate application of a uniform passivation coating, and
applicability in a vacuum system.

As a result, major problems are still observed that affect the life-time and output power characteristics of the cleaved devices.

Recently, substantial progress has been made towards resolving these problems. It has been found that cleaving in a vacuum immediately followed by an in-situ coating with a passivation layer of the contamination-free mirror facets allows the fabrication of highly stable AlGaAs laser diodes. With this method, devices have been obtained with very low degradation rates and high-power output performance.

A similar process has been disclosed in European Patent application 89.810 668.7, filed on Sep. 7, 1989. The embodiment described in the specification is suitable for a single bar or device processing, but is not directly applicable to volume laser device manufacturing. It does not address nor solve the additional problems encountered with batch processing such as the restrictive requirement of separating the bars immediately after cleaving in order to avoid facet damage.

Accordingly, it is a main object of the present invention to provide a method and apparatus for semiconductor wafer cleaving suitable for large scale or batch mode laser diode fabrication.

Another object is to provide a method and apparatus allowing cleaving of laser wafers in a high vacuum environment followed by in-situ passivation of the cleaved facets to avoid facet contamination.

A further object is to provide a method and apparatus for cleaving semiconductor wafers to form individual laser bars, each having cleaved facets, and to immediately separate neighbouring bars from each other, to avoid damage, and to allow selective coating of the facets.

SUMMARY OF THE INVENTION

The present invention solves the problem encountered when a wafer is scribed and planes where the wafer is to be fractured to form individual bars need to be defined. The wafer is placed between a pair of flexible transport bands and guided around a curved, large radius surface thereby applying a bending moment. With a moment of sufficient magnitude, individual bars are broken off the wafer, each bar with a front and back facet. When cleaving is performed on a bar, while still pressed against the curved surface, it is automatically separated to avoid damage on the facets of neighbouring bars. For further handling, e.g., for the transport of the bars to an evaporation station for in-situ passivation, provisions are made to keep the bars separated.

In one embodiment, the separation of the bars is maintained by the transport bands that are made of stretchable material. The bands, with the cleaved bars held inbetween, are longitudinally stretched as soon as they come off the curved surface. In a second embodiment, the transport bands separate after cleaving, thus releasing the bars one after the other. The bars are gripped and individually transferred to a magazine where they are kept separate until further processing in the evaporation station.

For laser devices with extreme power capabilities and high life-time requirements, cleaving and subsequent passivation are carried out in-situ in a vacuum system thereby preventing facet contamination prior to passivation.

A main advantage of the present invention is that it allows semiconductor wafer batch processing in a vacuum system. Wafer cleaving and subsequent passivation is done in-situ without breaking the vacuum. Using a proper passivation coating, preferably by means of a thin layer of Si, any interaction with the facet surface is prevented, thereby drastically reducing mirror degradation during laser operation. Thus, long life, high-power lasers can be obtained.

BRIEF DESCRIPTION OF THE DRAWINGS

The invention is described in detail below with reference to drawings which illustrate specific embodiments of the invention, and in which.

DETAILED DESCRIPTION

It has been shown that by cleaving and coating mirrors of semiconductor lasers in ultra-high-vacuum (UHV), creates a greatly increased power output and higher threshold against catastrophic optical damage as well as a longer lifetime than those cleaved in air. To achieve this goal, an efficient technique to cleave, separate, transport and coat the laser bars must be devised.

The present invention is designed to fulfill these requirements.

Before describing a preferred embodiment of the invention in greater detail, the underlying basic concepts will be briefly outlined with the aid of FIGS. 1 to 4.

Initially, the wafer to be cleaved is diamond-scratched to predetermine the crystallographic planes where fracturing is to take place, thereby, defining the length of the laser bars after cleaving which, in turn, determines the length of the laser cavity.

Figure 1:
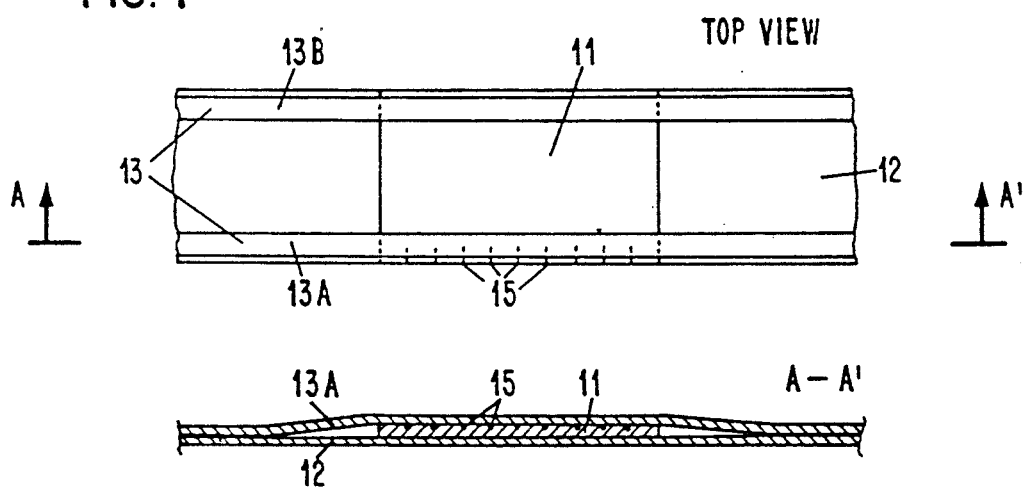
FIG. 1 illustrates how a scribed wafer is held between an upper and lower and transport bands.

FIG. 1 shows how a wafer 11 to be cleaved at planes defined by scribe lines 15 is inserted inbetween two flexible transport bands, a lower band 12 and an upper band 13. The bands are tightly pressed together (by means not shown in the drawing) to hold in position the wafer during processing. Scribe lines 15 are arranged to face the upper band in a direction perpendicular to that of the transport bands. In the example, the upper band consists of two narrow stripes 13A and 13B arranged over sections of the wafer 11 known not to be fragile and which are insensitive to pressure exerted by the stripes during the cleaving process. Such sturdy areas are located in the "window" inbetween the stripes and are thus not subjected to stress. Using a single narrow stripe, 13A or 13B, can provide even better results in that any stress on the wafer during fracturing is prevented. This results in a "gentle" cleave and high quality facets.

Figure 2:
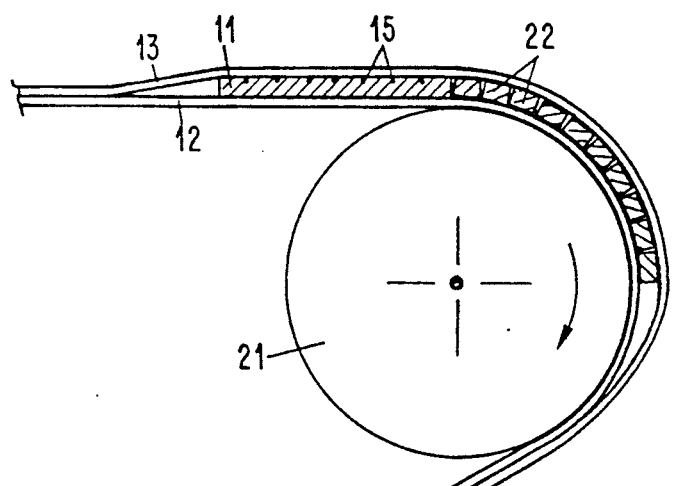
FIG. 2 is a schematic side view of a cleave roller over which a wafer, held in between an upper and lower and transport bands, is bent and cleaved to form bars that remain separate while still pressed against the roller.

FIG. 2 illustrates the principle applied in the actual cleaving process. The wafer 11, sandwiched between the flexible transport bands 12 and 13, advances to the cleaving station comprising a body 21 with a curved, large radius surface, of the order of 5 to 25 mm. Preferably, the body 21 is in the form of a roller, that rotates around its axis. The bands 12 and 13, with the wafer 11 inbetween, are pulled around the curved surface, the wafer being held down by upper band 13. A bending force is applied on the wafer, braking it in laser bars 22 at the position determined by scribe lines 15. After cleaving, the upper parts of the cleaved facets are separated to a distance given by the bending radius. This automatically prevents mechanical contact between the very fragile and critical facet surfaces thereby avoiding facet damage leading to device performance degradation is avoided.

Next, the cleaved bars are transported to the evaporation station for deposition of a passivation coating. It is essential that, the bars remain separated during the transport. Two possible ways are illustrated in FIGS. 3 and 4.

Figure 3:
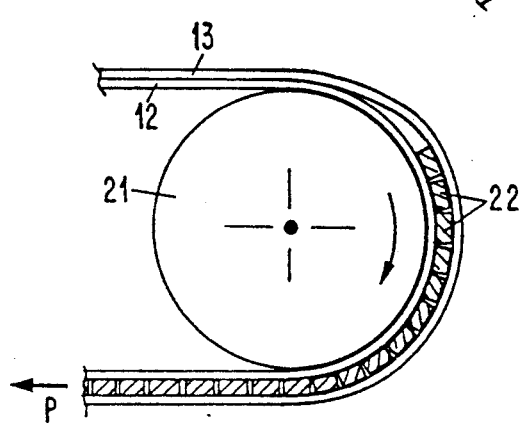
FIG. 3 is a schematic side view of a cleave roller showing how the cleaved bars are kept separate from one another by using stretchable transport bands.

In FIG. 3, stretchable bands 12 and 13 are used for the transport. After cleaving, the bands are stretched by a force F pulling the bands around the curved surface, (i.e., roller 21), whereby the individual laser bars remain separated. If the bars are to be coated while still in between the transport bands 12 and 13, the upper band must be designed to provide a window that exposes the sections of the facets onto which the passivation layer will be evaporated. Bands 13, consisting of one or two narrow stripes, as shown in FIG. 1, are suitable for this purpose.

Figure 4:
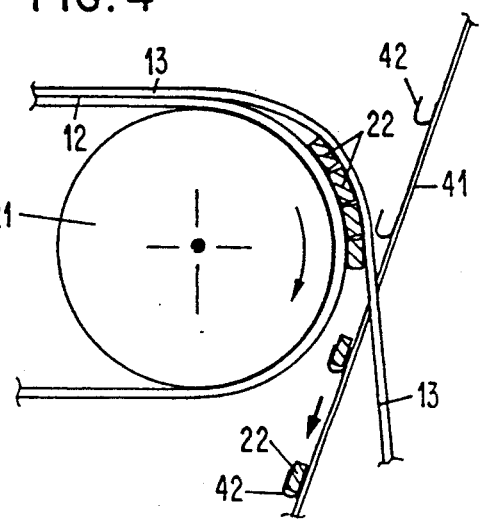
FIG. 4 is a schematic side view of a cleave roller showing how the cleaved bars are kept separate from one another by releasing them from the transport bands.

A second embodiment of an arrangement for bar separation is illustrated in FIG. 4. Here, the laser bars are removed from the transport bands 12 and 13 after cleaving, to be placed in a holder or magazine used to transport the batch of bars to the evaporation station. As shown, the transport bands are initially pressed together, holding the wafer until cleaving takes place. After cleaving, the upper band 13 is guided away from the lower band 12 thereby successively releasing the cleaved and separated bars 22. The bars are then gripped or caught, by transport belt 41 with hooks 42 for carrying the bars to a magazine (not shown) where total separation of the individual bars is achieved.

For in-situ coating of the cleaved facets in an UHV chamber, care must be taken in chosing materials in the cleave apparatus and the transport bands that are UHV-compatible.

Figure 5:
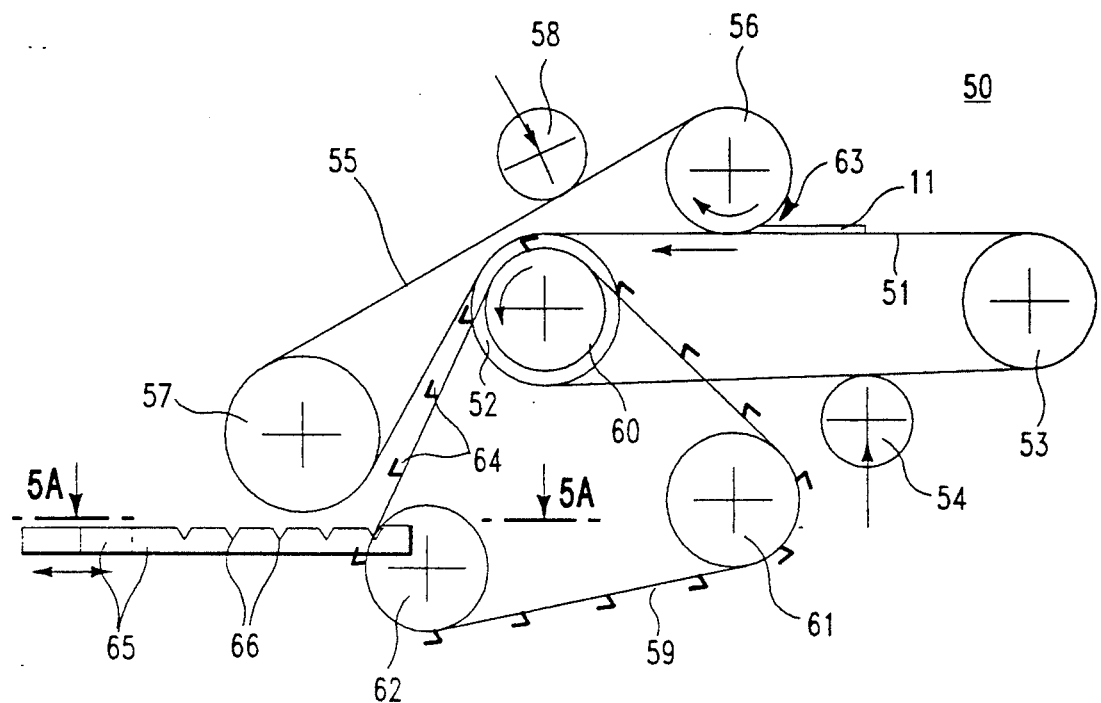
FIGS. 5 and 5A show schematic representation of a batch cleave apparatus designed in accordance with the present invention.

FIG. 5 is a schematic side view of a cleaving apparatus designed in accordance with the principle of the present invention and which are applicable to a UHV system.

The illustrated mechanism is suitable for performing wafer cleaving, bar separating, and subsequent transport of the cleaved bars to an evaporation station for in-situ passivation. Even if the apparatus were operated semimanually in that, e.g., wafer insertion and driving of the transport band is not fully automated, it provides for high throughput and minimum handling.

In the apparatus shown in FIG. 5, the lower transport band 51 is moved counter-clockwise around rollers 52 and 53, roller 52 being driven via coupling means from outside the UHV chamber. Constant tension on the band is maintained by means of roller 54 pressed against the band and/or by using a spring-loaded roller 53. The upper transport band 55 rotates around rollers 56 and 57 and is pressed against band 51. The friction between the two bands 51 and 55 drives the latter in a clockwise direction. The upper band 55 is tensioned by a pressure roll 58 and/or by using a spring-loaded roller 56 or 57.

A wafer 11 to be cleaved is inserted at point 63 between the lower and the upper transport bands. Accurate positioning is essential for a clean fracturing operation. The wafer, sandwiched between bands 51 and 55, is transported towards roller 52 and constrained to move and bend over the roller thereby imparting the necessary bending moment to cleave the wafer into bars as the transport bands move. As previously explained with reference to FIG. 2, the individual bars are separated during cleaving at least to the extent that facets of neighboring bars cannot damage each other.

In the preferred embodiment, transport bands 51 and 55 separate after cleaving has taken place. This causes each individual bar to be successively released. Transport belt 59 having shaped metal projections (hooks 64) is used for gripping purposes. Belt 59 moves at a speed higher than transport bands 51 and 55 to warrant that there is always a hook in place if a bar is released. It is driven around rollers 61, 62 and 60 in a counter-clockwise direction, roller 60 being arranged on the same axis as roller 52 but with a different diameter and independent rotation movement.

Figure 5A:
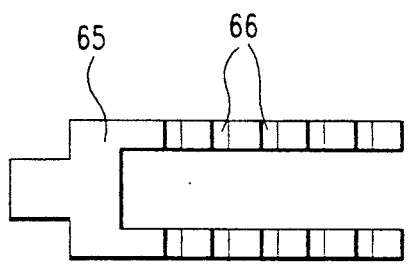

Having cleaved, separated and gripped the bars, it is a relatively simple matter to collect, arrange and transport the bars for coating. One possibility is illustrated in FIGS. 5 and 5A. A U-shaped holder 65, having arms with grooves 66 as shown, spans belt 59 at the position indicated in the drawing. As a bar supported by one of the hooks 64, moves downward the ends of the bar are guided into one of the tapered grooves 66. Holder 65 is advanced to the left, so that a vacant groove is ready to receive the next bar. The holder acts as a magazine for all the bars into which a wafer 11 is broken. When all grooves have been filled, the bars are secured in their positions (by means not shown in the drawing). Thereupon, the magazine 65 can be used to transport the batch of bars to the evaporation station of the vacuum system for the protective coating of the facets.

Figure 6A:
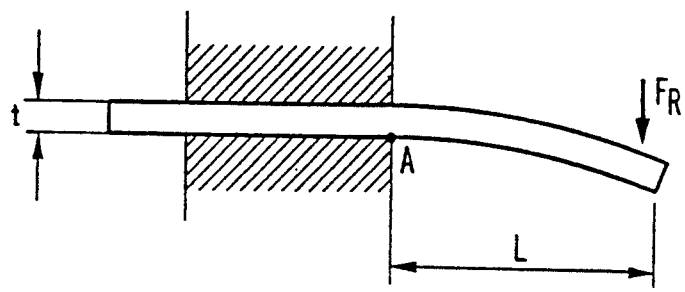
FIGS. 6A and B show schematic sketches used to highlight design conditions of the inventive batch cleave apparatus.
Figure 6B:
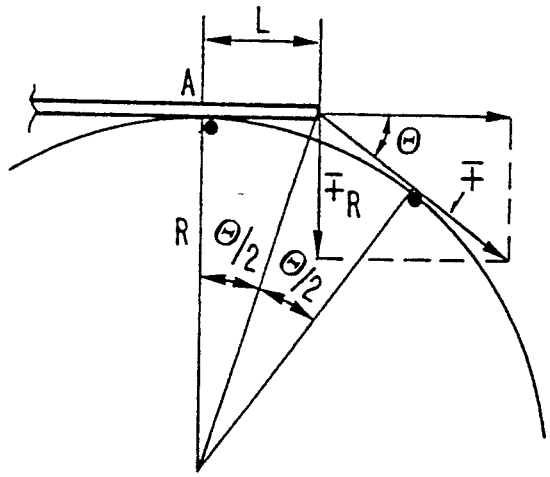

Referring now to FIGS. 6A and 6B, some of the essential requirements and conditions needed for designing and operating a cleave apparatus are outlined.

The natural cleavage planes of III/V compound semiconductors such as GaAs are those conventionally denominated {110}. For a laser, it is important that the resultant cleaved mirror surface be "perfect" in the sense of having no imperfections in the vicinity of the emitting facet region. To produce such a surface requires not only that the scribe lines used to define the cleaving plane be properly scratched at the edge of the wafer but also that a uniform tensile stress perpendicular to the direction of propagation of the cleave is applied. This, in turn, requires proper positioning of the wafer with respect to the applied bending force by accurately placing and tightly fixing it between the transport bands. Furthermore, this allows the wafer to fracture at the desired plane, by using a bending force which, is not be too different from an ideal value.

For the simple cantilever geometry of FIG. 6A, elementary considerations show that the strain S at the fulcrum A, caused by a bending moment $M = F_R \times L$, is given by $$S = \frac{6}{Ewt^2} \cdot M \tag{1}$$

where w is the width and t the thickness of the sample to be broken, and E is Young's modulus for the material.

When cleavage takes place at a critical strain $S_c$, the bending moment at which the sample will fracture is obtained from:

$$M_c = \frac{1}{6} \cdot Ewt^2 \cdot S_c = F_{Rc} \cdot L \tag{2}$$

For cleaving laser wafers over a roller as in the system of FIG. 5 when applying a bending moment via a flexible band to which a pulling force F is applied as in FIG. 6B, the cleaving force $F_R$ perpendicular to the wafer will be:

$$F_R = F \cdot \sin\Theta = F \cdot 2\frac{L}{R} \tag{3}$$

$$\text{since, for small angles } \Theta, \sin\Theta \approx \frac{2L}{\sqrt{R^2 + L^2}} \approx 2\frac{L}{R}$$

From equations (2) and (3) one obtains the force $F_c$ applied to the upper transport band that is required to obtain the necessary cleave moment $M_c$ when the wafer is advanced by a distance L, namely by a distance L, namely When the next scribe line was at point A:

$$F_c = F_{Rc} \cdot \frac{R}{2L} = M_c \cdot \frac{R}{2L^2}$$

or, for a wafer of given thickness and width $$F_c = \text{const.} \cdot \frac{R}{L^2}$$

It is to be noted that the critical moment $M_c$ that is required to cleave a wafer of a given material and cross-section, must be applied when the next scribe line arrives at point A, i.e., when L equals the desired length of the laser bar. Any substantial deviation will have a negative effect on the cleaving process, resulting in lower quality mirrors, or may even prevent that cleaving from taking place at the plane defined by the scribe line.

If the applied force F is smaller than $F_c$, $M_c = F_R \times L$ is reached only after that wafer has advanced a distance greater than L. As a result, the wafer will not break at the desired plane as defined by the scribe line. It will uncontrollably break inbetween scribe lines or at some subsequent scribe line, making the bar 2 L long.

Problems also arise in the case where F is larger than $F_c$, i.e., $M_c$ is reached before the scribe line has arrived at point A. Again, it is uncertain what will happen. The wafer may cleave at about point A resulting in an unsatisfactory facet and a bar that is too short, or it may again break at the scribe line under uncontrolled conditions. The problem gets worse with subsequent bars unless the pulling force F is properly corrected.

An exact calculation of F(c) is virtually impossible since it depends on factors such as the friction between the transport bands and the torque required to break the scratched wafer which cannot be determined with sufficient accuracy. However, adjustments to the tension applied to the transport bands quickly lead to an uncritical operation of the cleave apparatus. New adjustments are required before using wafers of a different thickness or width, or when the bar length to be obtained is changed.

A further important feature to be considered is the radius R of the roller over which the wafer is cleaved.

From equation (5) it is apparent that the required force $F_c$ is proportional to the radius R of the cleave roller because the effective force $F_R$, perpendicular to the wafer, becomes, for a given force F, smaller with increasing radius R. In order to avoid the necessity of using very large forces, requiring excessive friction between the transport bands, the roller should not be too big. On the other hand, severe operational problems arise in the case where rollers of small radius are used. One of the difficulties is seen in the fact that the wafer, inserted inbetween the transport bands, is kept in place and moved against any resistances merely by the friction between the wafer and the transport bands. When the wafer, before cleaving, is moved tangentially along and over the roller, a substantial resistance builds up and the friction is reduced because the wafer is, in extreme situations, lifted from the lower band. As a result, the forward force is insufficient to overcome the resistance.

In practice it has been observed that for proper operation of the cleaving system the relation L: R between the laser bar length and the roller radius should be between 10 and 50. For a bar length L of 0.5 mm, this means that the radius R should be $$5 \text{ mm} < R < 25 \text{ mm} \qquad (6)$$

In other words, any sharp wedges or "knives", and even small radius rollers (R = 1 to 2 mm) that have in the past been used for various cleaving techniques are not suited for the present invention.

The inventive method and apparatus herein described are designed for use in batch-fabricating semiconductor lasers. To illustrate the number of bars and laser chips that can be handled by a single vacuum chamber run it is assumed that the wafer length be 20 mm, the width 25 mm, of which 5 mm are used to firmly grip the ends of the bars as described above. For lasers of 0.5 mm length, this yields 40 bars which, for a chip or laser width of 0.25 mm, results in a total of $40 \times 80 = 3,200$ lasers.

In order to improve the efficiency of the process, particularly when carried out in a vacuum chamber, the system can be completed by adding (1) an input magazine arrangement for supporting and inserting a number of to-be-cleaved wafers, and (2) load locks for loading wafers and for withdrawing the coated bars. When loading the system with, e.g., 10 wafers, the throughput of the vacuum system could thus be increased to 32,000 lasers per run.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for batch cleaving a semiconductor wafer and coating the cleaved facets, comprising the steps of:
   scribing one surface of a semiconductor wafer with at least one scribe line to define the planes at which said semiconductor wafer is to be cleaved;
   placing said semiconductor wafer inbetween a flexible lower and an upper transport band, said semiconductor wafer being oriented in the direction of said at least one scribe line, and perpendicular to the longitudinal direction of said flexible lower and said upper transport bands;
   moving said flexible lower and upper transport bands with said semiconductor wafer being held inbetween, around a body having a curved, large radius surface, thereby applying a bending force suitable for cleaving said semiconductor wafer at said scribe line to form individual bars having cleaved facets at both ends, and separating adjoining bars to prevent facet damage;
   transporting said bars to an evaporation station while keeping adjoining bars separate; and
   coating each of said cleaved facets.

2. A method as in claim 1, wherein said body having a curved, large radius surface, is a roller that rotates around its axis.

3. The radius of the curved surface of the body of claim 2 is between 5 and 25 mm.

4. A method as in claim 1, where said coating applied at said evaporation station is a passivation layer.

5. A method as in claim 4, wherein said passivation layer consists of silicon.

6. A method as in claim 4, wherein said cleaving and coating steps are carried "in-situ", in the same environment.

7. A method as in claim 6, wherein said environment is an ultra-high vacuum.

8. A method as in claim 1, wherein the width of said flexible lower transport band is at least as wide as said semiconductor wafer, and wherein said upper transport band consists of one or two bands, each of said bands substantially narrower than said semiconductor wafer, and wherein said one or two bands make contact with regions where said semiconductor wafer is insensitive to external pressure applied during the cleaving step.

9. A method as in claim 1, wherein said flexible lower and upper transport bands are made of stretchable material.

10. A method as in claim 2, wherein said flexible lower and upper transport bands are individually guided around said roller so as to allow inserting and holding said semiconductor wafer until cleavage is completed and automatically releasing said cleaved bars thereafter.

11. A method as in claim 10, wherein one of said transport bands is advanced by driving one of said rollers, and wherein said other transport band is advanced by friction between said two transport bands.

12. A method as in claim 10, wherein gripping means are provided to catch said released, cleaved bars and transport said released and cleaved bars to a magazine where said released and cleaved bars are stored and kept separate from each other.

* * * * *